(12) United States Patent
Aslan et al.

(10) Patent No.: US 6,737,824 B1
(45) Date of Patent: May 18, 2004

(54) FAN ACCELERATION CONTROL

(75) Inventors: Mehmet Aslan, Milpitas, CA (US); Richard Dean Henderson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/260,996

(22) Filed: Sep. 30, 2002

(51) Int. Cl.$^7$ ................................................ H02P 7/00
(52) U.S. Cl. ..................... 318/471; 318/445; 318/461; 318/472
(58) Field of Search ................... 318/471, 472, 318/432, 435, 254, 461, 641, 445; 388/842, 847, 816, 831; 706/276; 417/2–10, 32

(56) References Cited

U.S. PATENT DOCUMENTS

| | | | | |
|---|---|---|---|---|
| 3,912,162 A | * | 10/1975 | Bauer et al. ................... 236/11 |
| 4,015,182 A | * | 3/1977 | Erdman ....................... 388/816 |
| 4,297,851 A | * | 11/1981 | Paddock et al. ............... 62/126 |
| 4,459,519 A | * | 7/1984 | Erdman ....................... 318/254 |
| 4,659,290 A | * | 4/1987 | Kundert ....................... 417/32 |
| 4,712,050 A | * | 12/1987 | Nagasawa et al. ........... 318/254 |
| 5,457,766 A | * | 10/1995 | Ko ............................. 388/831 |
| 5,847,526 A | * | 12/1998 | Lasko et al. ................. 318/471 |
| 6,191,546 B1 | * | 2/2001 | Bausch et al. .............. 318/471 |
| 6,204,623 B1 | * | 3/2001 | Levy et al. .................. 318/641 |
| 6,428,282 B1 | * | 8/2002 | Langley ......................... 417/2 |
| 6,545,438 B1 | * | 4/2003 | Mays, II ..................... 318/254 |
| 6,594,554 B1 | * | 7/2003 | Seem et al. ................. 700/276 |

* cited by examiner

*Primary Examiner*—Rina Duda
*Assistant Examiner*—Renata McCloud
(74) *Attorney, Agent, or Firm*—Mark R. Hennings; Merchant & Gould

(57) ABSTRACT

A circuit is arranged control the acceleration of a fan by limiting the rate of change in fan speed control signals. The control system includes an acceleration controller that low pass filters a target fan speed control signal. The low pass filtering signal minimizes abrupt changes in the fan speed. A sudden change in the speed of the fan often results in an audible noise that is undesirably distracting. Filtering the fan speed control signal advantageously slows the rate of the fan speed changes without having to change device drivers for controlling the fan.

18 Claims, 5 Drawing Sheets

FAN ACCELERATION CONTROL

FIELD OF THE INVENTION

The present invention relates generally to control systems, and more particularly to controlling the acceleration of a fan for temperature controlled systems.

BACKGROUND OF THE INVENTION

Intelligent system temperature control is an important consideration for many electronic systems, including systems such as personal computers. Such systems can be designed to vary the speed of a fan to regulate the temperature of the system. The speed of the fan is controlled by measuring a temperature of the system, selecting a desired fan speed in accordance with the measured temperature, and signaling the fan driver with a signal that conveys the target fan speed. Changes in the fan speed result in audible changes in the sound generated by the fan.

SUMMARY OF THE INVENTION

The present invention is directed towards a fan acceleration control system for limiting the rate of change in fan speed control signals. The control system includes an acceleration controller that low pass filters a target fan speed control signal. The low pass filtering signal minimizes abrupt changes in the fan speed. A sudden change in the speed of the fan often results in an audible noise that is undesirably distracting. Filtering the fan speed control signal advantageously slows the rate of the fan speed changes without having to change device drivers for controlling the fan.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
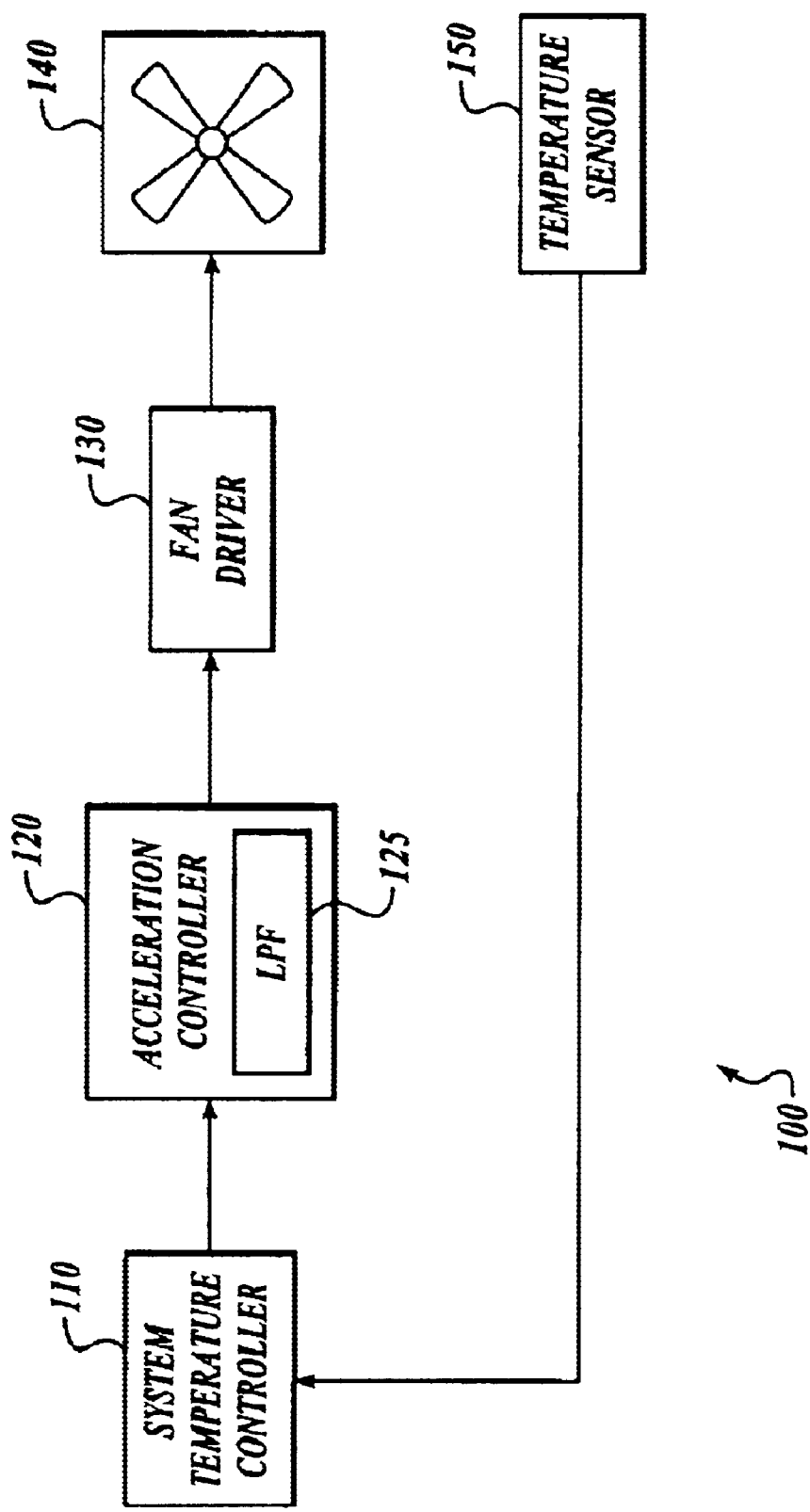
FIG. 1 is a schematic of an example of fan acceleration control system in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention is directed towards a fan acceleration control system for limiting the rate of change in fan speed control signals. The control system includes an acceleration controller that low pass filters a target fan speed control signal. The low pass filtering signal minimizes abrupt changes in the fan speed. A sudden change in the speed of the fan often results in an audible noise that is undesirably distracting. Filtering the fan speed control signal advantageously slows the rate of the fan speed changes without having to change device drivers for controlling the fan.

FIG. 1 is a schematic of an example of a fan acceleration control system in accordance with the present invention. As shown in the figure, system 100 includes System Temperature Controller 110, Acceleration Controller 120, Fan Driver 130, fan 140, and Temperature Sensor 150. Acceleration Controller 120 includes low pass filter 125.

System Temperature Controller 110 is coupled to Acceleration Controller 120 and Temperature Sensor 150. Acceleration Controller 120 is coupled to Fan Driver 130. Fan Driver 130 is coupled to fan 140.

System Temperature Controller 110 may be formed by using discrete components or by using a combination of hardware and algorithms (software). System Temperature Controller 110 may include a processor such as a microcontroller, microprocessor, state machine, combinatorial logic, a combination of these, and the like. System Temperature Controller 110, Acceleration Controller 120, Fan Driver 130, and Temperature Sensor 150 may be implemented on the same integrated circuit or on a combination of different integrated circuits.

Temperature Sensor 150 is arranged to measure a temperature at a temperature control point (TCP) within the system. The TCP is a physical location that represents a location in a system where temperature control is desired. The TCP may be located, for example, in an integrated circuit (such as a CPU) or other point in a system. Temperature Sensor 150 may be any temperature-measuring device. For example, Temperature Sensor 150 may be implemented as a diode in a substrate of an integrated circuit or as a stand-alone transistor.

System Temperature Controller 110 determines a target speed for fan 140 in response to the monitored temperature reading. The temperature is typically monitored every tenth of a second by System Temperature Controller 110, although faster and slower rates are possible. Typically higher fan speeds are used for higher monitored temperatures. System Temperature Controller 110 generates a target fan speed control signal that conveys the determined target fan speed to Acceleration Controller 120. Acceleration Controller 120 low pass filters the fan speed control signal to limit the rate of change of the signal whereby a filtered fan speed control signal is produced. The maximum rate of change of the target fan speed control signal may be selected in accordance with the rate at which the system temperature is monitored by System Temperature Controller 110.

In one example, the cutoff frequency for a low pass filter is selected such that the targeted fan speed is reached before an updated target fan speed control signal is received from System Temperature Controller 110. Filter parameters can be selected by means such as control registers and function pins (to programmably select, for example, values for internal components), external components of selected and/or adjustable values, and the like.

Fan driver 130 is coupled to the filtered fan speed control signal. The speed of fan 140 is controlled by Fan Driver 130. Fan Driver 130 can be used to buffer the fan speed control signal for the purpose of driving fan 140.

Figure 2:
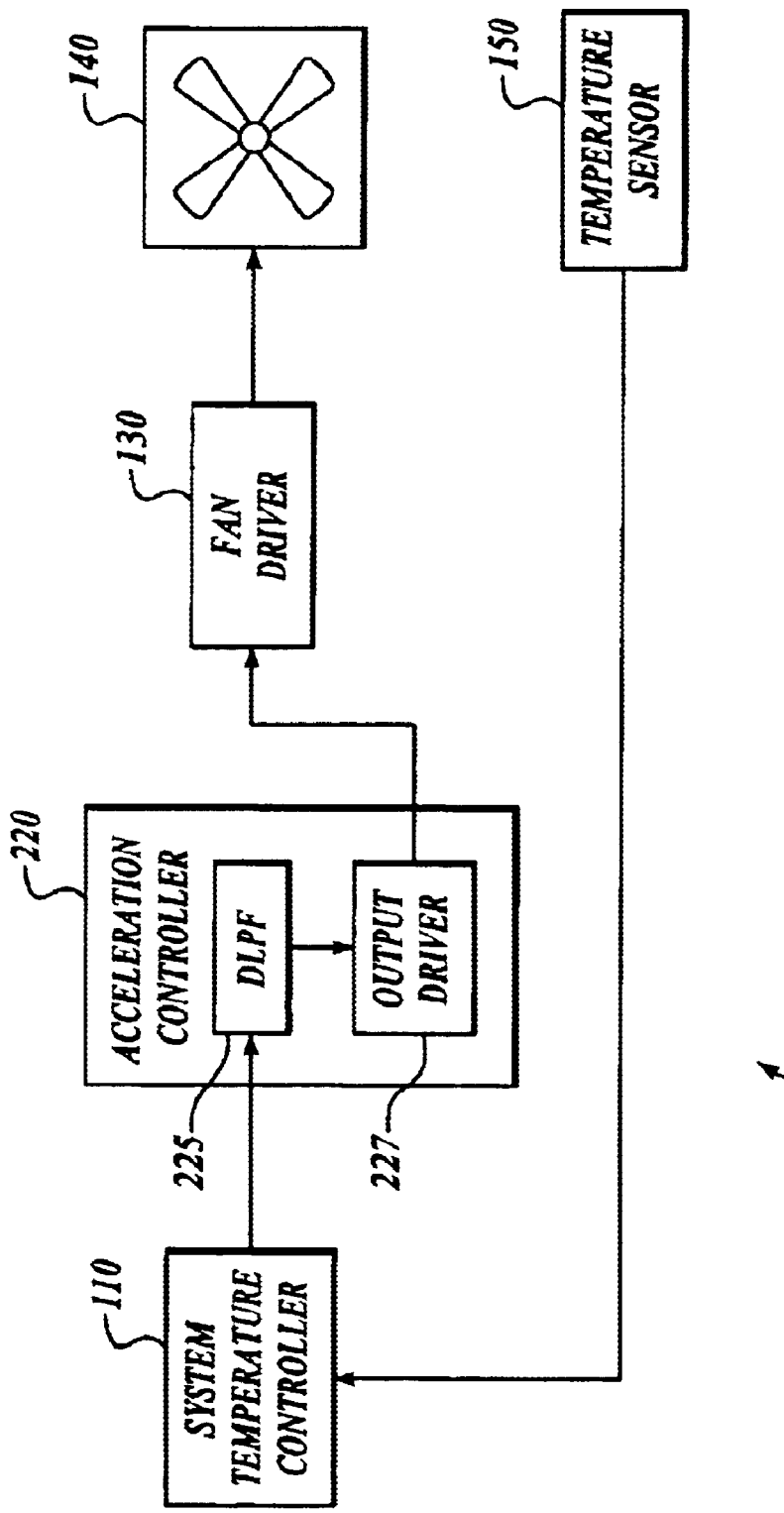
FIG. 2 is a schematic of an example of fan acceleration control system having a digital low pass filter in accordance with the present invention.

FIG. 2 is a schematic of an example of fan acceleration control system having a digital low pass filter in accordance with the present invention. As shown in the figure, system 200 includes System Temperature Controller 110, Acceleration Controller 220, Fan Driver 130, fan 140, and Temperature Sensor 150. Acceleration Controller 120 includes digital low pass filter (DLPF) 225 and Output Driver 227.

System Temperature Controller 110 is coupled to DLPF 225 and Temperature Sensor 150. DLPF 225 is coupled to Output Driver 227. Output Driver 227 is coupled to Fan Driver 130. Fan Driver 130 is coupled to fan 140.

Acceleration Controller 220 receives digital data from System Temperature Controller 110. DLPF 225 of Acceleration Controller 220 digitally filters the received digital data. The digitally filtered data is coupled to Output Driver 227, where the digitally filtered data is converted to a signal that is suitable for signaling Fan Driver 130. Fan Driver 130 controls the speed of fan 140 in response to the gradually changing fan speed information in the filtered signal.

In various embodiments, DLPF 225 may be a FIR filter, an IIR filter, or a simple timer/counter.

Figure 3:
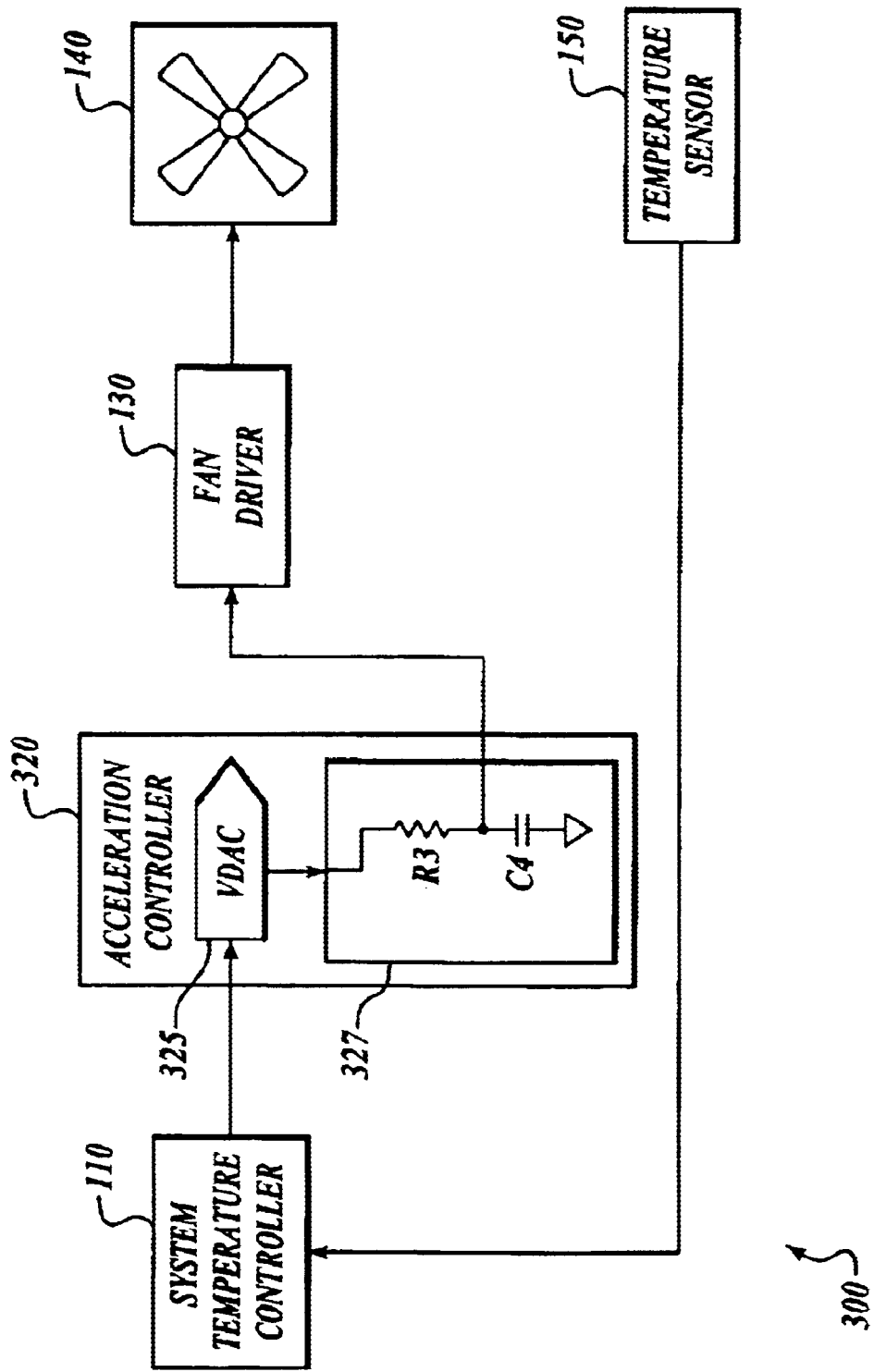
FIG. 3 is a schematic of an example of fan acceleration control system having a Voltage DAC and an analog filter in accordance with the present invention.

FIG. 3 is a schematic of an example of fan acceleration control system having a Voltage DAC and an analog filter in accordance with the present invention. As shown in the figure, system 300 includes System Temperature Controller 110, Acceleration Controller 320, Fan Driver 130, fan 140, and Temperature Sensor 150. Acceleration Controller 320 includes voltage DAC (VDAC) 325 and low pass filter 327.

Low pass filter 327 includes resistor R3 and capacitor C3. Resistor R3 and capacitor C3 may be implemented on the same substrate as Acceleration Controller 320, or alternatively, implemented as external components. Using external components permits larger components to be used, such as those that are required for lower frequency low pass filters.

System Temperature Controller 110 is coupled to VDAC 325 and Temperature Sensor 150. VDAC 325 is coupled to low pass filter 327. Low pass filter 327 is coupled to Fan Driver 130. Fan Driver 130 is coupled to fan 140.

Acceleration Controller 320 receives digital data from System Temperature Controller 110. VDAC 325 converts the received digital data to an output voltage. The output voltage is coupled to low pass filter 327, where the output voltage is low pass filtered to produce a filtered fan speed control signal. Fan Driver 130 controls the speed of fan 140 in response to the gradually changing fan speed information in the filtered fan speed control signal.

Figure 4:
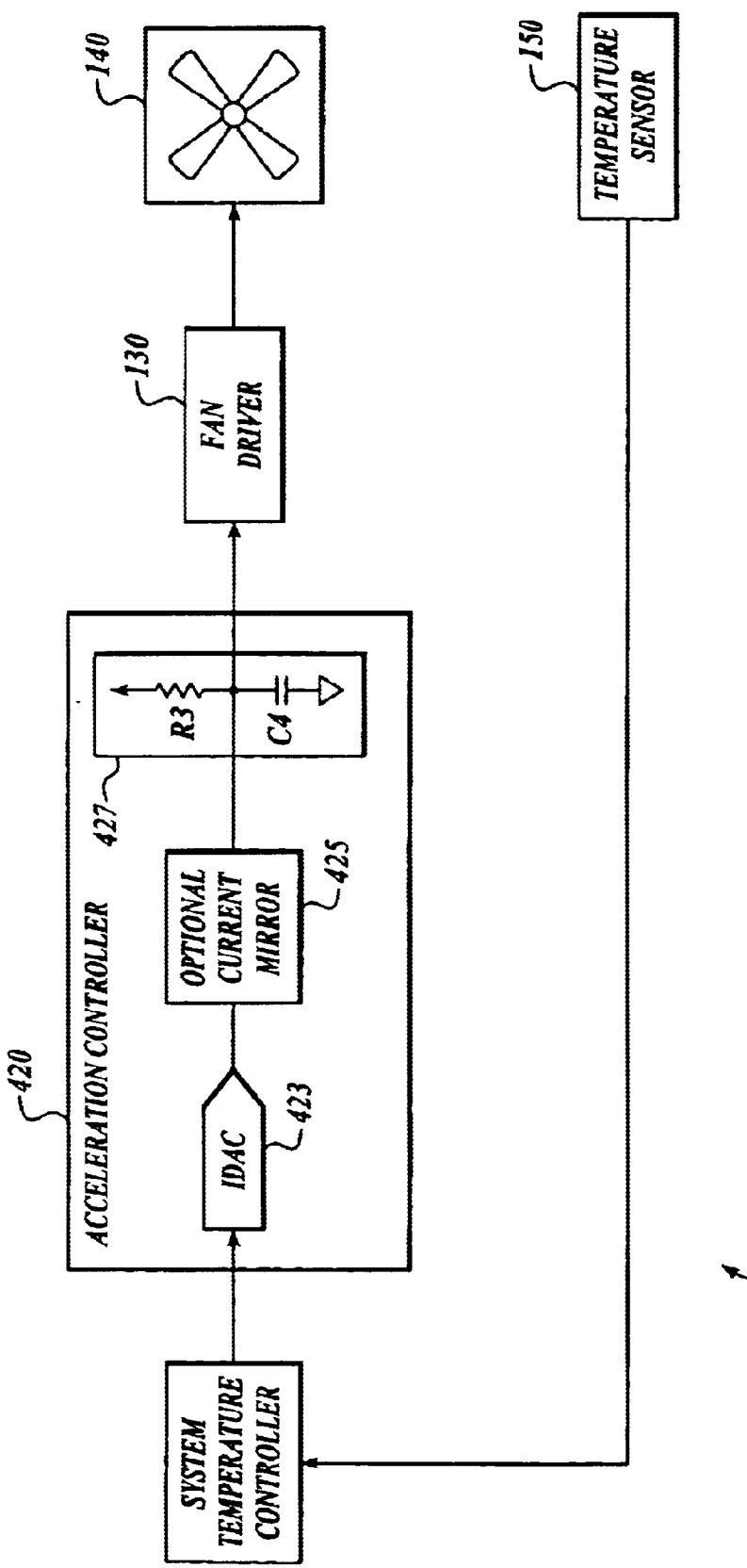
FIG. 4 is a schematic of an example of fan acceleration control system having a current DAC and an analog filter in accordance with the present invention.

FIG. 4 is a schematic of an example of fan acceleration control system having a current DAC and an analog filter in accordance with the present invention. As shown in the figure, system 400 includes System Temperature Controller 110, Acceleration Controller 420, Fan Driver 130, fan 140, and Temperature Sensor 150. Acceleration Controller 420 includes current DAC (IDAC) 423, optional Current Mirror 425 and low pass filter 427.

An example low pass filter 427 includes resistor R4 and capacitor C4. Resistor R4 and capacitor C4 may be implemented on the same substrate as Acceleration Controller 420, or alternatively, implemented as external components.

System Temperature Controller 110 is coupled to IDAC 423 and Temperature Sensor 150. IDAC 423 is coupled to optional Current Mirror 425. Current Mirror 425 is coupled to low pass filter 427. (IDAC 423 is coupled to low pass filter 327 when optional Current Mirror 425 is not included.) Low pass filter 327 is coupled to Fan Driver 130. Fan Driver 130 is coupled to fan 140.

Acceleration Controller 420 receives digital data from System Temperature Controller 110. IDAC 423 sources an output current in response to the received digital data. The sourced output current is coupled to Current Mirror 425, which sinks a current in response to the sourced output current. Current Mirror 425 is coupled to low pass filter 427, where Current Mirror 425 sinks a current that is low pass filtered to produce a filtered fan speed control signal. Fan Driver 130 controls the speed of fan 140 in response to the gradually changing fan speed information in the filtered fan speed control signal.

The maximum and minimum speeds of fan 140 are determined by the maximum and minimum voltages produced at low pass filter 427. The voltages are expressed as follows:

$Vout_{max} = VDD$, and $Vout_{min} = VDD - (R \cdot I_{max})$ where $Vout_{max}$ is equal to the maximum voltage, VDD is the first voltage reference, $Vout_{min}$ is the minimum voltage, R is the value of the resistor of the low pass filter in ohms, and Imax is the maximum current that is supplied by a current DAC.

The value of resistor R4 can be adjusted to control the minimum voltage of the filtered fan speed control signal. The minimum voltage is equal to the supply voltage minus the quantity of the value of resistor R4 times the maximum current of the signal. The maximum voltage of the filtered fan speed control signal is equal to the supply voltage.

The value of capacitor C4 can be used to control the rate of change of the filtered fan speed control signal. The capacitance of C4 is inversely proportional to the rate of change of the signal provided by the low pass filter.

Figure 5:
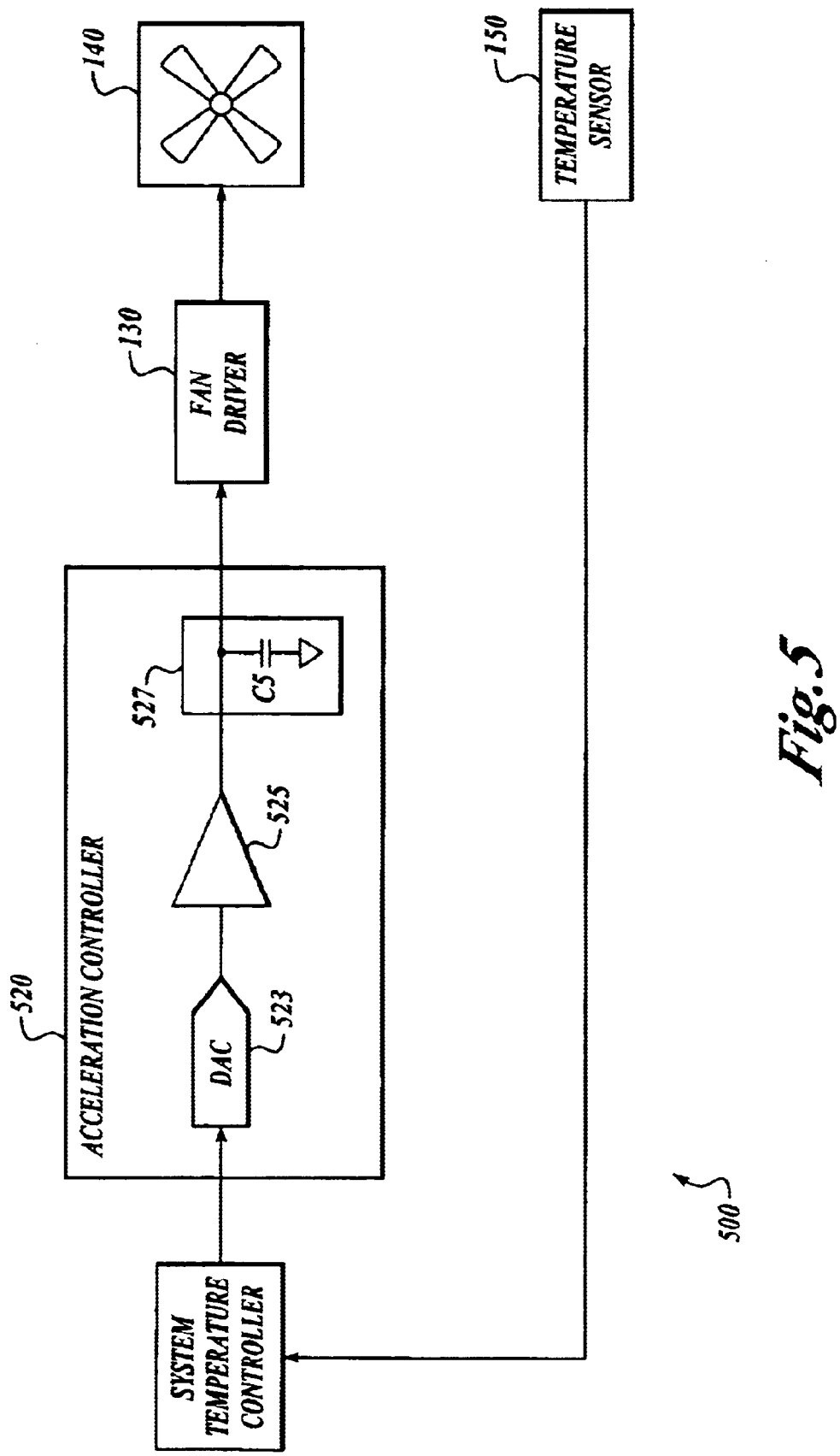
FIG. 5 is a schematic of an example of fan acceleration control system having a DAC and a current limited buffer in accordance with the present invention.

FIG. 5 is a schematic of an example of fan acceleration control system having a DAC and a current limited buffer in accordance with the present invention. As shown in the figure, system 500 includes System Temperature Controller 110, Acceleration Controller 520, Fan Driver 130, fan 140, and Temperature Sensor 150. Acceleration Controller 520 includes DAC 523, current limited buffer 525 and low pass filter 527.

An example low pass filter 527 includes capacitor C5. Capacitor C5 may be implemented on the same substrate as Acceleration Controller 520, or alternatively, implemented as external components.

System Temperature Controller 110 is coupled to DAC 523 and Temperature Sensor 150. DAC 523 is coupled to current limited buffer 525. Current limited buffer 525 is coupled to low pass filter 527. Low pass filter 527 is coupled to Fan Driver 130. Fan Driver 130 is coupled to fan 140.

Acceleration Controller 520 receives digital data from System Temperature Controller 110. DAC 523 converts the received digital data to an output voltage. The output voltage is coupled to current limited buffer 525, which provides a current limited signal in response to the output of DAC 523. Current limited buffer 525 is coupled, to low pass filter 527. Current limited signal is low pass filtered to produce a filtered fan speed control signal. Fan Driver 130 controls the speed of fan 140 in response to the gradually changing fan speed information in the filtered fan speed control signal.

Other embodiments of the invention are possible without departing from the spirit and scope of the invention. For example, the cutoff frequency can be selected such that the filtered fan speed control signal will not reach the targeted fan speed before the unfiltered fan speed control signal is updated by System Temperature Controller 110. In such a case, the fan speed is dependent upon several temperature measurements.

The above specification, examples and data provide a complete description of the manufacture and use of the composition of the invention. Since many embodiments of the invention can be made without departing from the spirit and scope of the invention, the invention resides in the claims hereinafter appended.

We claim:

1. A circuit for controlling the acceleration of a fan in a system, comprising:
    a system temperature controller that is configured to produce a target fan speed control signal in response to a first measured system temperature, maintain the target fan speed control signal at a constant level for a predetermined time interval, and change the target fan speed control signal in response to a second measured system temperature that is made after the end of the predetermined time interval;
    an acceleration controller that is configured to receive the target fan speed control signal and produce a filtered fan speed control signal by applying a low pass filter to the target fan speed control signal; and
    a fan driver that is configured to receive the filtered fan speed control signal and drive the fan in response such that the fan achieves before the end of the predetermined time interval a speed that is determined by the target fan speed control signal.

2. The circuit of claim 1, wherein the target fan speed control signal is a digital signal.

3. The circuit of claim 2, wherein the acceleration controller is configured to digitally low pass filter the target fan speed control signal.

4. The circuit of claim 2, wherein the acceleration controller is configured to convert the target fan speed control signal into an analog target fan speed control signal such that the analog target fan speed control signal is low pass filtered by an R-C network.

5. The circuit of claim 2, wherein the acceleration controller is configured to produce an analog current signal in response to the target fan speed signal, and wherein the analog current signal is low pass filtered by an R-C network.

6. The circuit of claim 2, wherein the acceleration controller is configured to produce an analog voltage signal in response to the target fan speed signal, wherein the analog voltage signal is buffered by a current limited buffer to produce a current limited signal, and wherein the current limited signal is coupled to a capacitor.

7. A circuit for controlling the acceleration of a fan in a system, comprising:
    means for producing a target fan speed control signal in response to a first measured system temperature;
    means for maintaining the target fan speed control signal at a constant level for a predetermined time interval;
    means for low pass filtering the target fan speed control signal to produce a filtered fan speed control signal;
    means for driving the fan in response to the filtered fan speed control signal such that the fan achieves before the end of the predetermined time interval a speed that is determined by the target fan speed control signal; and
    means for changing the target fan speed control signal in response to a second measured system temperature that is made after the end of the predetermined time interval.

8. The circuit of claim 7, wherein the target fan speed control signal is a digital signal.

9. The circuit of claim 7, wherein the means for low pass filtering is a digital filter.

10. The circuit of claim 7, further comprising means for converting the target fan speed control signal into an analog target fan speed control signal such that the analog target fan speed control signal is low pass filtered.

11. The circuit of claim 7, further comprising:
    means for producing an analog current signal in response to the target fan speed signal such that the analog current signal is low pass filtered.

12. A method for controlling the acceleration of a fan in a system, comprising:
    producing a target fan speed control signal in response to a first measured system temperature;
    maintaining the target fan speed control signal at a constant level for a predetermined time interval;
    producing a filtered fan speed control signal by applying a low pass filter to the target fan speed control signal;
    driving the fan in response to the filtered fan speed control signal such that the fan achieves before the end of the predetermined time interval a speed that is determined by the target fan speed control signal; and
    changing the target fan speed control signal in response to a second measured system temperature that is made after the end of the predetermined time interval.

13. The method of claim 12, wherein the target fan speed control signal is produced as a digital signal.

14. The method of claim 12, wherein the target fan speed control signal is digitally low pass filtered.

15. The method of claim 12, further comprising:
    converting the target fan speed control signal into an analog target fan speed control signal; and
    low pass filtering the analog target fan speed control signal.

16. The method of claim 12, further comprising:
    producing an analog current signal in response to the target fan speed signal; and
    low pass filtering the analog current signal.

17. The method of claim 16 wherein a current limited buffer is used to produce the analog current signal.

18. A circuit for controlling the acceleration of a fan in a system, comprising: a system temperature controller that is configured to produce a target fan speed control signal in response to a measured system temperature, maintain the target fan speed control signal at a constant level for a predetermined time interval, and change the target fan speed control signal in response to a second measured system temperature that is made after the end of the predetermined time interval; an acceleration controller that is configured to receive the target fan speed control signal and produce a filtered fan speed control signal by applying a digital low pass filter to the target fan speed control signal; and a fan driver that is configured to receive the filtered fan speed control signal and drive the fan in response such that the fan achieves before the end of the predetermined time interval a speed that is determined by the target fan speed control signal.

* * * * *